(12) United States Patent
Bailis et al.

(10) Patent No.: US 6,545,501 B1
(45) Date of Patent: Apr. 8, 2003

(54) METHOD AND SYSTEM FOR USE OF A FIELD PROGRAMMABLE FUNCTION WITHIN A STANDARD CELL CHIP FOR REPAIR OF LOGIC CIRCUITS

(75) Inventors: Robert Thomas Bailis, Cary, NC (US); Charles Edward Kuhlmann, Raleigh, NC (US); Charles Steven Lingafelt, Durham, NC (US); Ann Marie Rincon, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/015,923

(22) Filed: Dec. 10, 2001

(51) Int. Cl.⁷ .............................................. H03K 19/003
(52) U.S. Cl. ............................. 326/10; 326/9; 326/41; 326/37
(58) Field of Search .......................... 326/9, 10, 37–41

(56) References Cited

U.S. PATENT DOCUMENTS

| | | | | |
|---|---|---|---|---|
| 6,075,381 A | * | 6/2000 | LaBerge | 326/41 |
| 6,134,173 A | | 10/2000 | Cliff et al. | 265/230.03 |
| 6,173,419 B1 | | 1/2001 | Barnett | 714/28 |
| 6,178,541 B1 | | 1/2001 | Joly et al. | 716/17 |
| 6,182,206 B1 | | 1/2001 | Baxter | 712/43 |
| 6,182,247 B1 | | 1/2001 | Hermann et al. | 714/39 |
| 6,191,614 B1 | | 2/2001 | Schultz et al. | 326/41 |
| 6,209,118 B1 | | 3/2001 | LaBerge | 716/1 |
| 6,181,159 B1 | | 4/2001 | Rangasayee | 326/39 |
| 6,211,697 B1 | | 4/2001 | Lien et al. | 326/41 |
| 6,219,819 B1 | | 4/2001 | Vashi et al. | 716/3 |
| 6,219,833 B1 | | 4/2001 | Solomon et al. | 717/5 |
| 6,223,148 B1 | | 4/2001 | Stewart et al. | 703/25 |
| 6,223,313 B1 | | 4/2001 | How et al. | 714/724 |
| 6,226,776 B1 | | 5/2001 | Panchul et al. | 716/3 |
| 6,230,119 B1 | | 5/2001 | Mitchell | 703/27 |
| 6,237,021 B1 | | 5/2001 | Drummond | 709/201 |
| 6,247,147 B1 | | 6/2001 | Beenstra et al. | 714/39 |
| 6,249,143 B1 | | 6/2001 | Zaveri et al. | 326/40 |
| 6,252,422 B1 | | 6/2001 | Patel et al. | 326/80 |
| 6,253,267 B1 | | 6/2001 | Kim et al. | 710/103 |
| 6,255,845 B1 | * | 7/2001 | Wong et al. | 326/38 |
| 6,256,296 B1 | | 7/2001 | Ruziak et al. | 370/277 |
| 6,260,087 B1 | | 7/2001 | Chang | 710/100 |
| 6,260,182 B1 | | 7/2001 | Mohan et al. | 716/12 |
| 6,260,185 B1 | | 7/2001 | Sasaki et al. | 716/18 |

OTHER PUBLICATIONS

C. E.Kuhlmann et al., U.S. Pending Patent Application Ser. No. 10/016346 (docket RPS920010125US1), "Field Programmable Network Processor and Method for Customizing a Network Processor"/ No date.

R. T. Bailis et al., U.S. Pending Patent Application Ser. No. 10/016772 (docket RPS920010126US1), "Method and System for Use of an Embedded Field Programmable Gate Array Interconnect for Flexible I/O Connectivity"/ No date.

(List continued on next page.)

*Primary Examiner*—Michael Tokar
*Assistant Examiner*—Anh Q Tran
(74) *Attorney, Agent, or Firm*—Sawyer Law Group

(57) ABSTRACT

An application specific integrated circuit (ASIC) is disclosed. The ASIC comprises a standard cell. The standard cell includes a plurality of logic functions. The ASIC further includes a field programmable (FP) logic function for coupling the plurality of logic functions together via a plurality of input and output stages. The FP logic function can be programmed for field repair of at least one of the plurality of the logic functions. A method and system in accordance with the present invention utilizes a distributed field programmable logic block in conjunction with standard cells to provide for field repair and improved redundancy. To describe the features of the present invention in more detail, refer now to the following description in conjunction with the accompanying drawings.

18 Claims, 4 Drawing Sheets

OTHER PUBLICATIONS

R. T. Bailis et al., U.S. Pending Patent Application Ser. No. 10/016449 (docket RPS920010127US1), "Method and System for Use of a Field Programmable Gate Array Function within an Application Specific Integrated Circuit (ASIC) to Enable Creation of a Debugger Client within the ASIC"/ No date.

R. T. Bailis et al., U.S. Pending Patent Application Ser. No 10/016448 (docket RPS920010128US1), "Method and System for Use of a Field Programmable Function within an Application Specific Integrated Circuit (ASIC) to Access Internal Signals for External Observation and Control"/ No date.

R. T. Bailis et al., U.S. Pending Patent Application Ser. No. 10/015922 (docket RPS920010129US1), "Method and System for Use of a Field Programmable Interconnect within an ASIC"/ No date.

R. T. Bailis et al., U.S. Pending Patent Application Ser. No. 10/015920 (docket RPS920010130US1), "Method and System for USe of a Field Programmable Function within a Chip to Enable Configurable I/O Signal Timing Characteristics"/ No date.

R. T. Bailis et al., U.S. Pending Patent Application Ser. No. 10/015921 (docket RPS920010132US1), "Method and System for Use of a Field Programmable Gate Array (FPGA) Cell for Controlling Access to On–Chip Functions of a System on a Chip (SOC) Integrated Circuit"/ No date.

* cited by examiner

METHOD AND SYSTEM FOR USE OF A FIELD PROGRAMMABLE FUNCTION WITHIN A STANDARD CELL CHIP FOR REPAIR OF LOGIC CIRCUITS

CROSS-RELATED APPLICATIONS

The present application is related to the following listed seven applications: Ser. No. 10/016,346, filed Dec. 10, 2001, entitled "Field Programmable Network Processor and Method for Customizing a Network Processor;" Ser. No. 10/016,772, filed Dec. 10, 2001, entitled "Method and System for Use of an Embedded Field Programmable Gate Array Interconnect for Flexible I/O Connectivity;" Ser. No. 10/016,449, filed Dec. 10, 2001, entitled "Method and System for Use of a Field Programmable Gate Array (FPGA) Function Within an Application Specific Integrated Circuit (ASIC) to Enable Creation of a Debugger Client Within the ASIC;" Ser. No. 10/016,448, filed Dec. 10, 2001, entitled "Method and System for Use of a Field Programmable Function Within an application Specific Integrated Circuit (ASIC) To Access Internal Signals for External Observation and Control;" Ser. No. 10/015,920, filed Dec. 10, 2001, entitled "Method and System for Use of a Filed Programmable Function Within a Chip to Enable Configurable I/O Signal Timing Characteristics;" Ser. No. 10/015,923, filed Dec. 10, 2001, entitled "Method and System for Use of a Field Programmable Function Within a Standard Cell Chip for Repair of Logic Circuits;" Ser. No. 10/015,922, filed Dec. 10, 2001, entitled "Method and System for Use of a Field Programmable Interconnect Within an ASIC for configuring the ASIC;" and Ser. No. 10/015,921, filed Dec. 10, 2001, entitled "Method and System for Use of a Field Programmable Gate Array (FPGA) Cell for Controlling Access to On-Chip Functions of a System on a Chip (S)C) Integrated Circuit;" assigned to the assignee of the present application, and filed on the same date.

FIELD OF THE INVENTION

The present invention relates generally to an application specific integrated circuit (ASIC) and more particularly to the use of a field programmable function within an ASIC.

BACKGROUND OF THE INVENTION

In today's business climate, internet technology (IT) customers increasingly require that common business applications utilizing IT equipment must meet mission-critical, 7 days a week, 24 hours a day requirements. Companies that transact business over the Internet, such as direct sales, have become world wide companies literally overnight. Companies such as these must be able to run their web access and server equipment 24 hours a day to meet world wide demand for their products and services.

Because of its low cost, commodity personal computer hardware and software has enabled IT administrators to utilize redundant systems and quick replacement parts to make up for inherently low system reliability. Now, however, parts reuse and parts recycling are becoming important issues as industry profit margins decrease and operating costs and environmental issues have become top priority items. Suppliers and customers will give priority to a process whereby failing hardware can be repaired and reused as long as the repair costs are minimal.

The reliability of a hardware subsystem is also improved by minimizing the intrinsic failure rate (IFR) of the components and/or by removing single points of failure. The IFR for a component can be improved through design refinement and/or manufacturing process refinement. Usually a "best IFR" limit is reached at which point it becomes cost prohibitive or physically impossible to reduce the IFR any further.

Redundant logic circuits and redundant components are a widely used method for achieving system reliability well beyond that which can be achieved through IFR efforts alone. Redundant circuits may also be used in the final stages of the ASIC manufacturing process to increase the percentage yield of shippable parts.

A common logic design method for standard cell parts uses redundant logic circuits which can be wired in during the ASIC manufacturing process to replace a failing logic circuit. A second design approach is to design an external interface to the ASIC connected to internal select logic to allow failed logic circuits to be swapped with redundant logic circuits in the field. Both of these design approaches require that every logic circuit be duplicated inside the ASIC and adds gate delays to the design, because they use select/deselect logic which invariably adds multiplexer logic delay.

Accordingly, what is needed is a system and method for field repair of a standard cell ASIC that overcomes the above-identified problems

SUMMARY OF THE INVENTION

An application specific integrated circuit (ASIC) is disclosed. The ASIC comprises a standard cell. The standard cell includes a plurality of logic functions. The ASIC further includes a field programmable (FP) logic function for coupling the plurality of logic functions together via a plurality of input and output stages. The FP logic function can be programmed for field repair of at least one of the plurality of the logic functions.

A method and system in accordance with the present invention utilizes a distributed field programmable logic block in conjunction with standard cells to provide for field repair and improved redundancy. To describe the features of the present invention in more detail, refer now to the following description in conjunction with the accompanying drawings.

DETAILED DESCRIPTION

The present invention relates generally to an application specific integrated circuit (ASIC) and more particularly to the use of a field programmable function within an ASIC. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

A method and system in accordance with the present invention utilizes a distributed field programmable logic block in conjunction with standard cells to provide for field repair and improved redundancy.

FP Logic Block for Field Repair

Figure 1:
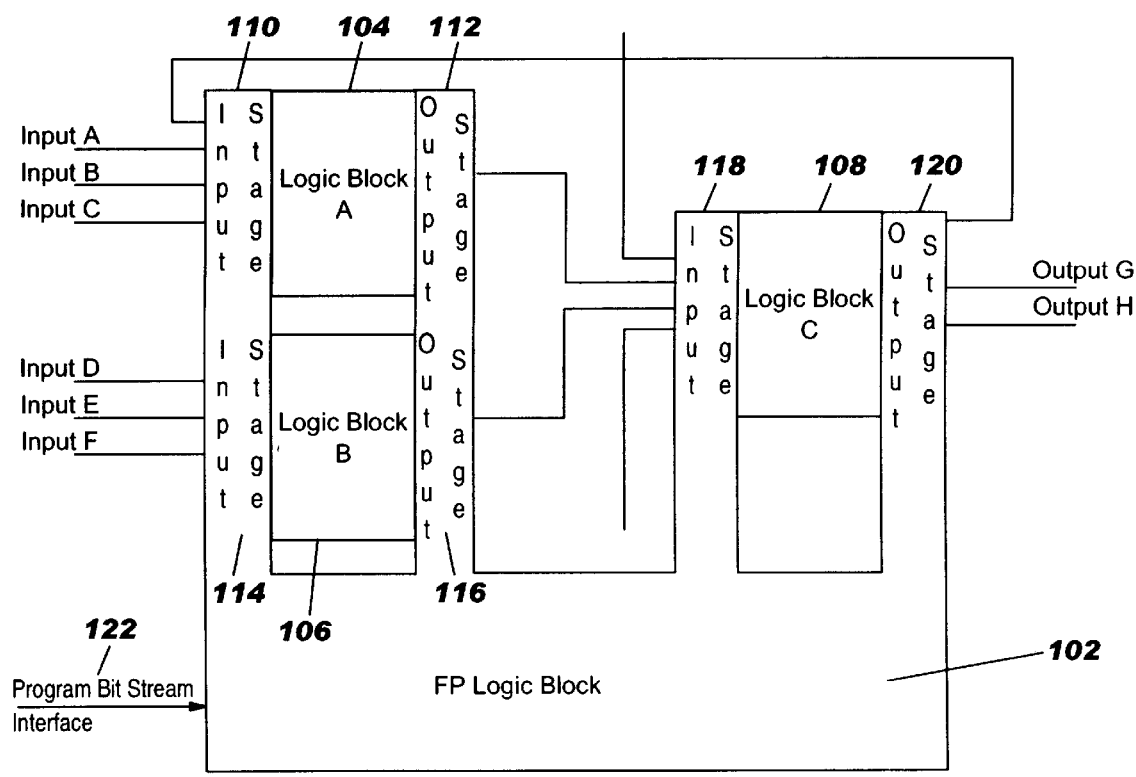
FIG. 1 is a block diagram showing a ASIC in accordance with the present invention.

FIG. 1 is a block diagram showing a ASIC in accordance with the present invention. The ASIC 100 is broken up into a plurality of standard cell logic blocks 104, 106 and 108 which are coupled together to form the complete ASIC design. Normally each standard cell logic block 104, 106 and 108 would be wired together directly as part of the logic synthesis process. In accordance with the present invention, however, each logic block 104, 106 and 108 is coupled together using programmable logic cells for the input logic blocks 110, 114 and 118, respectively, and the output logic stages 112, 116 and 120, respectively, of each of the logic blocks 104, 106 and 108. The programmable logic cells within each input and output stage are part of a Field Programmable (FP) logic block 102 included in the ASIC. The FP logic block 102 can be programmed during ASIC reset using an encoded serial bit stream, similar to Field Programmable Gate Arrays (FPGAs).

The configuration for the ASIC 100 would include a program bit stream 122 which programs the logic blocks 104, 106 and 108 for all of the input stages 110, 114 and 118 and the output stages 112, 116 and 120 so that the ASIC is connected and functioning as designed. If a portion of the ASIC should fail, then the ASIC contained within one or more bad logic blocks may be programmed into the FP logic block 102 and inserted into the remaining good portion of the standard cell logic through the programmable input stages 110, 114 and 118 and programmable output stages 112, 116 and 120 surrounding each bad logic block.

Figure 2:
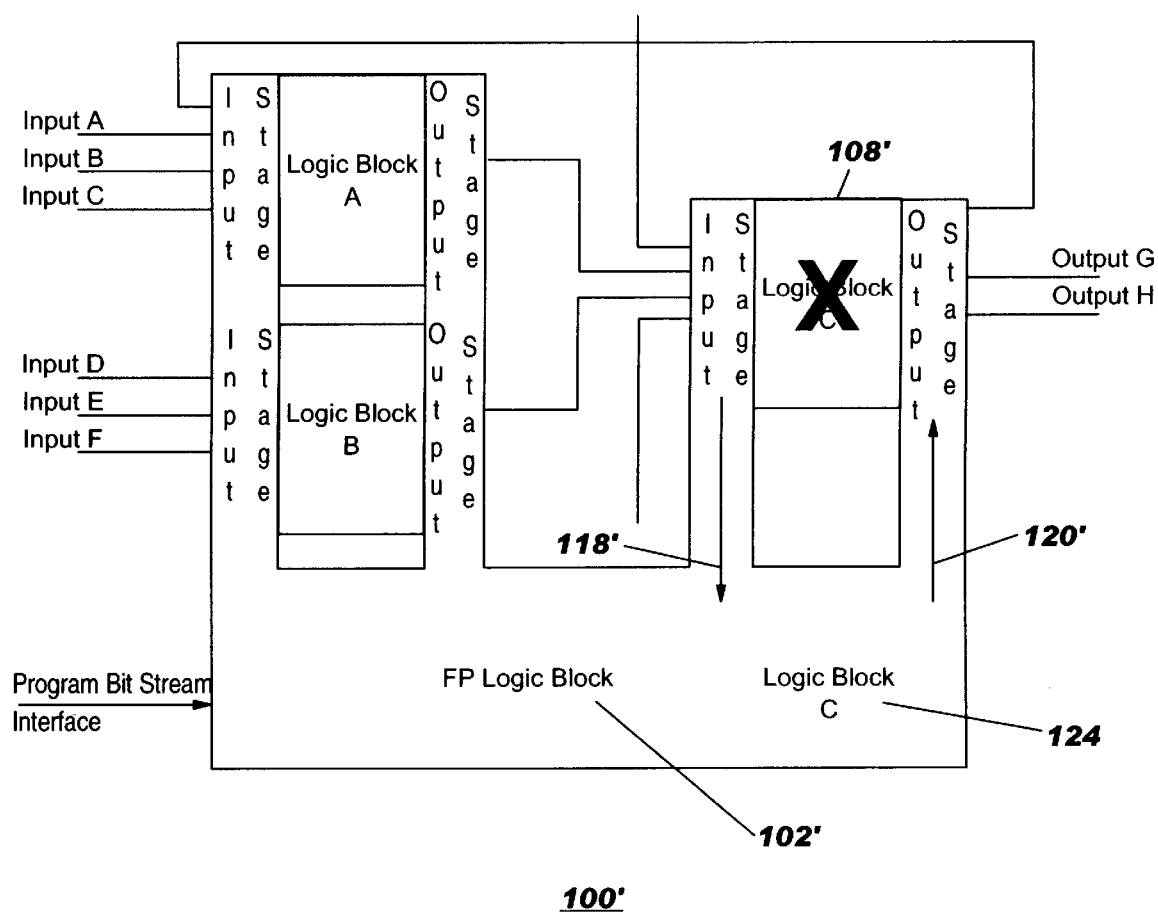
FIG. 2 illustrates the ASIC where the logic block, implemented in standard cell gates, has found to be defective and is replaced by new logic block implemented in the Field Programmable Logic Block.

FIG. 2 illustrates the ASIC 100' where the logic block 108', implemented in standard cell gates, has been found to be defective and is replaced by new logic block 124 implemented in the FP logic block 102'. Inputs 118' to and outputs 120' from logic block 108' are rerouted in programmable logic from the old, defective circuit to the new, replacement circuit 124.

The design process for the ASIC 100 can produce a library of program bit stream files corresponding to every possible failing combination of standard cell logic blocks. The ASIC designer may either design in special probe points to help determine which area of the ASIC has failed and hence which program bit stream should be used, or a menu of program bit stream files can be programmed into the FP logic block portion 102' of the ASIC 100', one at a time, until the ASIC is functioning normally again. In either case, the use of the FP logic block 102' integrated with the standard cell logic in this way allows the defective part to be repaired without removing it from its operating environment, thus saving repair time and expense for replacement parts.

FP Logic Block for Redundancy

Figure 3:
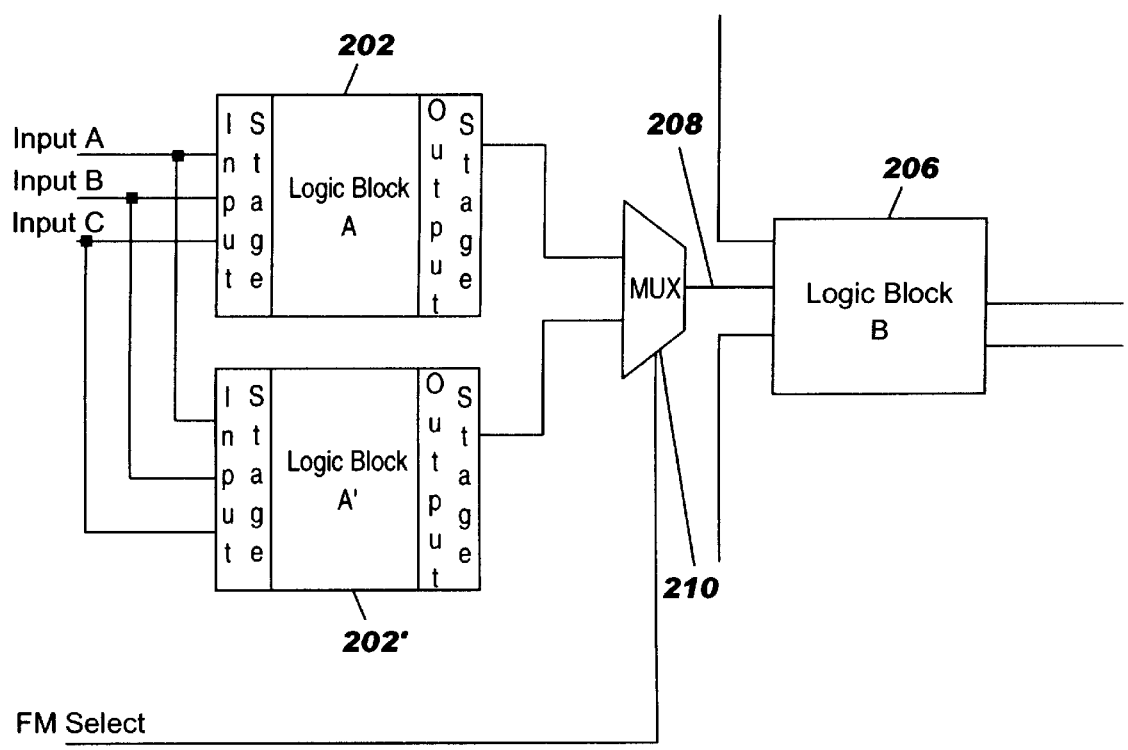
FIG. 3 is a block diagram of two redundant logic blocks feeding a third logic block.

FIG. 3 is a block diagram of two redundant logic blocks feeding a third logic block. In this embodiment logic block 202' is for redundancy. Either logic block 202 or logic block 202' is required to connect to logic block 206, but not both. Any input signals from logic block 206 or any other logic blocks to logic block 202 must also be routed to logic block 202'. The outputs from logic block 202 are multiplexed with the identical outputs from logic block 202' and the single set of outputs 208 from the multiplex 210 are routed to logic block 206. There are two negative side effects to this design approach. All inputs to logic block 202 must drive a second set of loads and a multiplex delay must be added to all outputs from logic blocks 202 and 202'.

Figure 4:
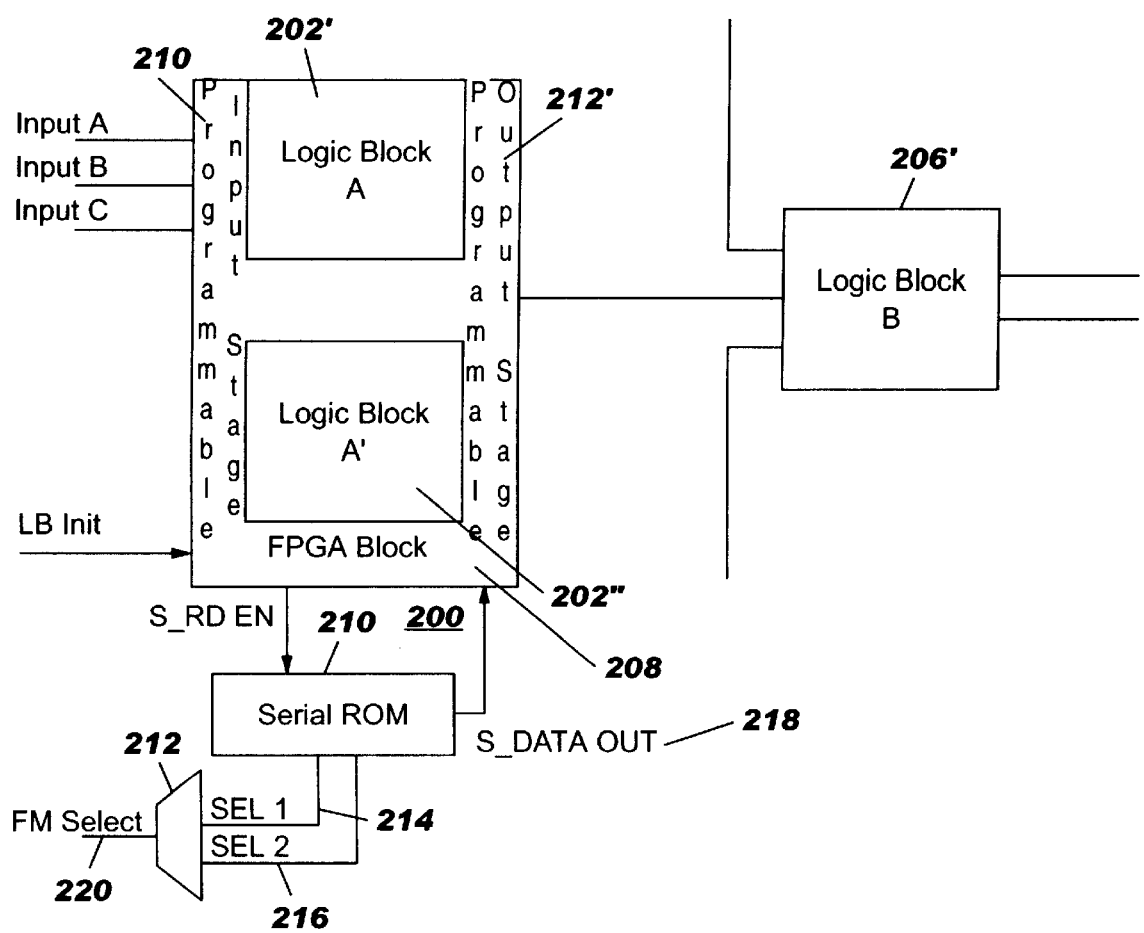
FIG. 4 is a block diagram that is similar to that of FIG. 3 except that a field programmable (FPGA) logic block is used to select the redundant logic blocks.

FIG. 4 is a block diagram that is similar to that of FIG. 3 except that a field programmable (FPGA) logic block is used to select the redundant logic blocks. The input stage 210 and the output stage 212 in logic blocks 202' and logic block 202" are constructed in programmable logic. The programmable logic core is initialized from a serial bit stream, S_DATA OUT 218 sent to it by a serial ROM device 210. The "Fault Mode Select" input 212 is used to select a correct serial ROM bank (not shown) where one bank programs the input and output stage logic for logic block 202' and another bank programs the input and output stage logic for logic block 202". The signal LB_Init is used to initiate a reload of the programmable logic block from the serial ROM 210. The system shown in FIG. 4 is an improvement over the system shown in FIG. 1 because it presents a single electrical load to Inputs A, B and C and it does not require the extra multiplex device with its added delay between logic block 202' and logic block 206'. The programmable logic block 200 is used to switch logic block 202' or logic block 202" into the circuit path without adversely affecting the propagation delay.

The serial ROM 210 shown in FIG. 4 can be implemented internal or external to the ASIC 200. For the application of redundant logic circuits to increase parts yield out of the factory, the ROM cells can be contained in the ASIC product and are programmed during the wafer or die test phase. In another embodiment, for very complex designs with many redundant circuits and/or where die size is an issue, the FPGA programming bits can be contained in an external ROM part attached to the ASIC through an FPGA boot interface.

One of ordinary skill in the art will readily recognize that the programmable Input/Output stage logic can be duplicated for each redundant circuit and can all be controlled with a common Fault Mode (FM) signal 220. In another embodiment, more than one fault mode condition may also be configured by using multiple FM signals routed to additional ROM bank selects feeding one or more programmable logic blocks.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An application specific integrated circuit (ASIC) comprising:
    a standard cell, the standard cell including a plurality of logic functions; and
    a field programmable (FP) logic function for coupling the plurality of logic functions together via a plurality of input and output stages wherein the FP logic function can be programmed for field repair of at least one of the plurality of the logic functions.

2. The ASIC of claim 1 wherein the field repair is performed by providing an encoded serial bit stream to the FP logic.

3. The ASIC of claim 1 wherein at least one logic function of the standard cell that is defective is replaced by programming the FP logic function.

4. The ASIC of claim 1 wherein a menu of bit stream files can be programmed into the FP logic function until the ASIC is functioning normally.

5. The ASIC of claim 1 wherein at least two of the plurality of logic functions are redundant and the FP logic function is utilized to select one of the at least two logic functions.

6. The ASIC of claim 5 wherein an input stage of a logic function presents only one electrical load to the corresponding input signals.

7. The ASIC of claim 6 wherein a signal is provided externally to initiate a load.

8. The ASIC of claim 6 wherein a select signal to a ROM is utilized to program the FP logic function.

9. The ASIC of claim 8 wherein the ROM is implemented internal to the ASIC.

10. The ASIC of claim 9 wherein the ROM is implemented external to the ASIC.

11. The ASIC of claim 5 wherein a redundant logic function is inserted into a logic path of the ASIC, without requiring a multiplexer circuit to select between the redundant logic function and a primary logic function.

12. An application specific integrated circuit (ASIC) comprising:

a standard cell, the standard cell including at least two logic functions which are redundant; and a field programmable (FP) logic function coupled to at least two logic functions to provide a programmable input stage and a programmable output stage, wherein the FP logic function can be programmed to select one of the at least two functions.

13. The ASIC of claim 12 wherein an input stage of a logic function presents only one electrical load to the corresponding input signals.

14. The ASIC of claim 13 wherein a signal is provided externally to initiate a load.

15. The ASIC of claim 13 wherein a select signal to a ROM is utilized to program the FP logic function.

16. The ASIC of claim 15 wherein the ROM is implemented internal to the ASIC.

17. The ASIC of claim 15 wherein the ROM is implemented external to the ASIC.

18. The ASIC of claim 13 wherein a redundant logic function is inserted into a logic path of the ASIC, without requiring a multiplexer circuit to select between the redundant logic function and a primary logic function.

* * * * *